(12) United States Patent
Terletzki

(10) Patent No.: US 6,501,298 B1
(45) Date of Patent: Dec. 31, 2002

(54) LEVEL-SHIFTING CIRCUITRY HAVING "LOW" OUTPUT DURING DISABLE MODE

(75) Inventor: Hartmud Terletzki, Pleasant Valley, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/664,826

(22) Filed: Sep. 19, 2000

(51) Int. Cl.[7] .......................................... H03K 19/0175
(52) U.S. Cl. ............................. 326/68; 326/81; 326/80
(58) Field of Search ............................. 326/68, 80, 81, 326/56, 57, 58

(56) References Cited

U.S. PATENT DOCUMENTS

| | | | |
|---|---|---|---|
| 4,707,623 A | * | 11/1987 | Bismarck .................... 307/475 |
| 4,820,941 A | * | 4/1989 | Dolby et al. ................ 307/475 |
| 6,181,165 B1 | * | 1/2001 | Hanson et al. ................ 326/81 |

\* cited by examiner

*Primary Examiner*—Michael Tokar
*Assistant Examiner*—Anh Tran
(74) *Attorney, Agent, or Firm*—Daly, Crowley & Mofford, LLP

(57) ABSTRACT

Level-shifting circuitry having a level shifting section and an enable/disable section. The level shifting section is responsive to an input logic signal. The input logic signal has a first voltage level representative of a first logic state or a second voltage level representative of a second logic state. The level-shifting section provides an output logic signal having a third voltage level representative of the logic state of the input logic signal. The enable/disable section is coupled to the level shifting section and is responsive to an enable/disable signal for driving the output terminal of the level-shifting section to a predetermined voltage level during a disable mode. A switch is responsive to the enable/disable signal for preventing current to the level shifting section during the disable mode.

3 Claims, 2 Drawing Sheets

LEVEL-SHIFTING CIRCUITRY HAVING "LOW" OUTPUT DURING DISABLE MODE

BACKGROUND OF THE INVENTION

This invention relates generally to level-shifting circuitry.

As is known in the art, level-shifting circuitry is used to shift lower voltage signal levels to higher voltage signal levels. One example of such circuit is shown in FIG. 1. Such circuit is formed on a semiconductor chip and includes a pair of N type Metal Oxide Semiconductor Field Effect Transistors (MOSFETs) $N_1$ and $N_2$ and a pair of P type MOSFETs $P_1$ $P_2$ arranged as shown. The P type MOSFETs have the bulk silicon connected to an external +2.5 volt power source. The N type MOSFETs have the bulk silicon connected to ground. The N type MOSFET $N_1$ is a low threshold voltage transistor having. The gate of transistor $N_1$ is connected to an internal +2.1 volt source. The input voltage (IN) is a logic signal having logic 1, here represented by +2.1 volts or a logic 0 state, here represented by ground potential. Here, the level-shifter also provides an inversion in the logic state of the input signal as well as shifting the input signal logic 1 state from +2.1 volts to a higher voltage output signal logic 1 state, here +2.5 volts. Thus, in operation, when the input voltage is logic 0, transistors $N_1$, and $P_2$ are "on" and transistors $P_1$ and $N_2$ are "off", thereby providing a logic 1, here a +2.5 volt level, at the output OUT. Thus, the input logic 1 condition of a +2.1 volt input signal has been shifted to a +2.5 volt output logic 1. On the other hand, when the input voltage IN is logic 1 (i.e., here +2.1 volts), transistors $N_1$, and $P_2$ are "off" and transistors $P_1$ and $N_2$ are "on", thereby providing ground potential (i.e., an output logic 0) at the output OUT.

SUMMARY OF THE INVENTION

In accordance with the present invention, level-shifting circuitry is provided having a level-shifting section responsive to an input logic signal. The input logic signal has a first voltage level representative of a first logic state or a second voltage level representative of a second logic state. The level-shifting section provides an output logic signal having a third voltage level representative of the first logic state of the input logic signal. The level-shifting circuitry also includes an enable/disable section responsive to an enable/disable signal for driving the output logic signal to a predetermined voltage level during a disable mode.

In one embodiment, the level-shifting section includes: an input transistor having a control electrode, a first electrode coupled to the input logic signal, and a second electrode. An output pair of serially coupled complementary type transistors is provided. A first one of the pair of transistors has a first electrode coupled to a source of the third voltage level and a control electrode coupled to the second electrode of the input transistor. (it should be noted that in the case of a FET, the terms first and second electrode refer to source and drain electrodes, it being understood that while each transistor has a source and drain electrode, the terms may be used interchangeable. Further, in the case of a FET, the term control electrode refers to the gate electrode). A junction between the output pair of transistors provides an output terminal for the level-shifting circuitry. A control electrode of the second one of the pair of transistors is connected to the first electrode of the input transistor.

In one embodiment, the level-shifting section includes an additional transistor. The additional transistor has a control electrode connected to the junction, a first electrode coupled to the source of the third voltage level and a second electrode connected to the second electrode of the input transistor. In one embodiment, the input transistor and the additional transistor are of opposite conductivity type.

In one embodiment, the enable/disable circuit includes a gating transistor having a first electrode connected to the junction and a second electrode connected to the second electrode of the second one of the pair of transistors. An inverter is included coupled between the first electrode of the input transistor and a control electrode of the gating transistor.

In one embodiment, a switch is responsive to the enable/disable signal for preventing current to the additional transistor when in the disable mode.

In one embodiment, the switch is responsive to an output of the inverter and is coupled between the source of the third voltage level and: (1) the output terminal; (2) the first electrode of the additional transistor; and, (3) the first electrode of the first one of the pair of transistors.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
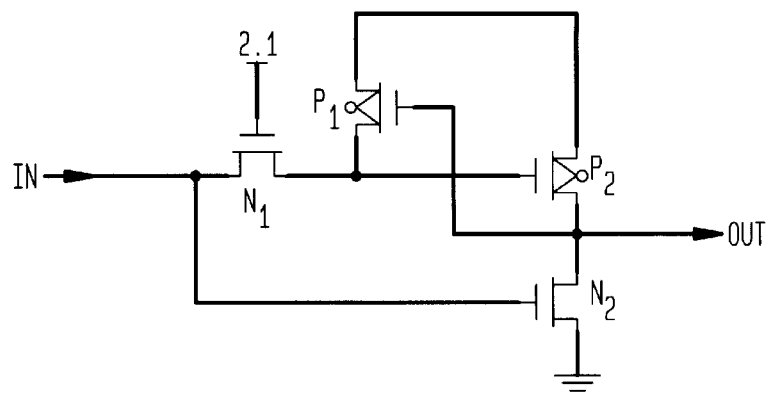
FIG. 1 is a schematic diagram of a level-shifting circuit according to the PRIOR ART.
Figure 2:
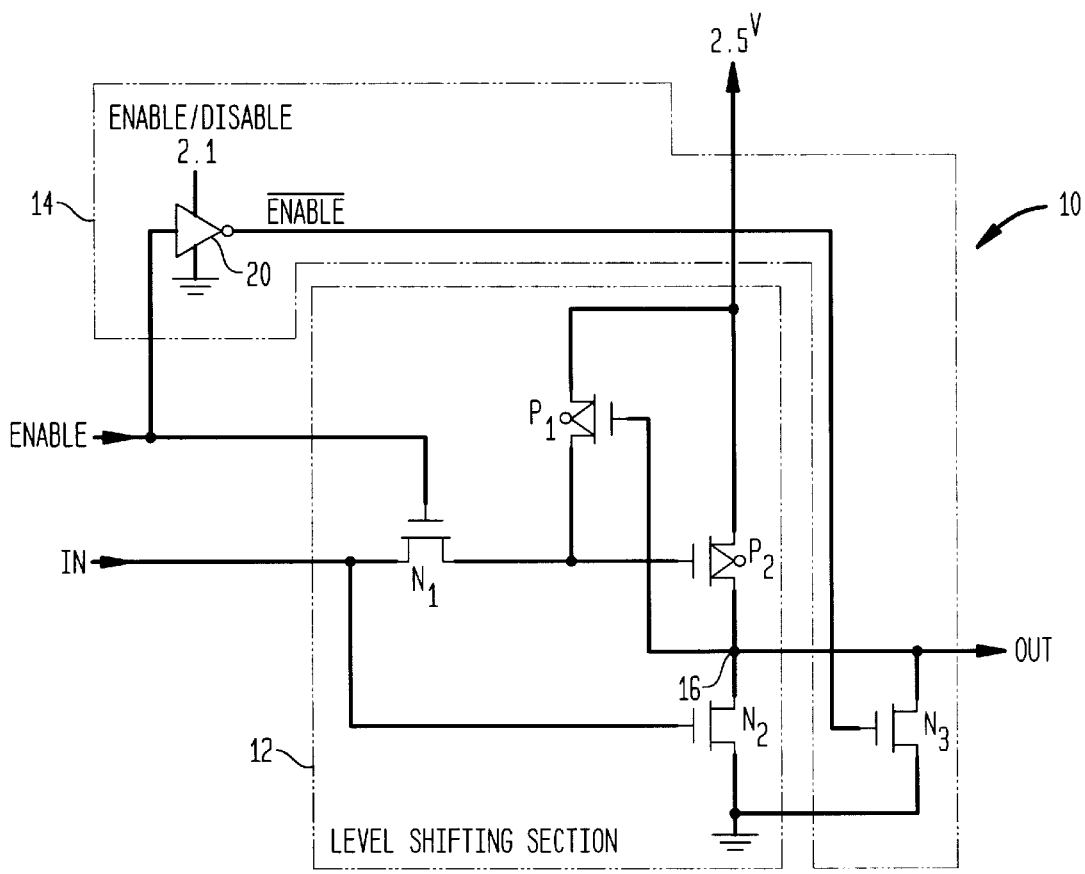
FIG. 2 is a schematic diagram of a level-shifting circuit according to the invention.

Referring now to FIG. 2, level-shifting circuitry 10 is shown to include: a level-shifting section 12 responsive to a input logic signal IN and an enable/disable section 12 fed by an enable/disable signal ENABLE. The input logic signal IN has a first voltage level, here +2.1 volts representative of a first input logic state, here logic 1, and a second voltage level, here ground, representative of a second input logic state, here logic 0.

The level-shifting section 10 provides an output logic signal OUT. The output logic signal OUT has a third voltage level, here +2.5 volts representative of the first output logic state, here logic 1, or the second voltage level, here ground, representative of the second output logic state, here logic 0. Here, during the enable mode (to be described hereinafter), in response to the input logic signal IN having an input logic 1 state (i.e., +2.1 volts), the output logic signal OUT will be ground thereby representing an output logic 0 state. On the other hand, during the enable mode, in response to the input logic signal IN having an input logic 0 state, here ground, the output logic signal OUT will be +2.5 volts thereby representing an output logic 1 state. During a disable mode, the enable/disable section 14 drives the voltage on output OUT to a predetermined voltage, here the output voltage at the output terminal OUT of the level-shifting circuitry 10 is driven low, i.e., ground, during the disable mode independent of the logic state of the input signal IN.

More particularly, the level-shifting section 12 includes an input transistor $N_1$ having a control, here gate, electrode coupled to an enable signal ENABLE, a first electrode coupled to the input logic signal IN, and a second electrode. The level-shifting section 12 includes a pair of complementary type transistors, P type MOSFET $P_2$, and N type MOSFET $N_2$ serially coupled between the source of the third voltage level, here an external +2.5 volt source, and the second voltage level, here ground. The control electrode, here gate, of a first one of the pair of transistors $P_2$, $N_2$, here transistor $P_2$ is coupled to the second electrode of the input transistor N type MOSFET $N_1$. A junction 16 between the pair of transistors $P_2$, $N_2$ provides an output terminal OUT for the level shifting circuitry 10. The control electrode, here gate, of the second one of the pair of transistors $P_2$, $N_2$, here transistor $N_2$, is connected to the first electrode of the input transistor $N_1$. An additional transistor, P type MOSFET $P_1$ has a control, here gate, electrode connected to the junction 16, a first electrode coupled to the source of the third voltage level, here +2.5 volts and a second electrode connected to both the second electrode of the input transistor $N_1$ and the control electrode of the first one of the pair of transistors $P_2$.

The enable/disable section 12 is coupled to the level-shifting section 10 and is responsive to the enable/disable signal (ENABLE). The enable/disable signal is a logic signal having the first voltage level, +2.1 volts, during the enable mode and having the second voltage level, ground, during a disable mode. The enable/disable section 14 drives the output logic signal OUT to a predetermined voltage level, here to the second voltage level, i.e., ground, during the disable mode.

More particularly, the enable/disable section 14 includes a gating transistor, N MOSFET $N_3$ having a first electrode connected to the junction 16 and the output terminal OUT, and a second electrode connected to the second electrode of transistor $N_2$. The enable/disable section 14 also includes an inverter 20 coupled between the first electrode of the input transistor $N_1$ and a control electrode of the gating transistor $N_3$. The inverter 20 is connected to an internal, +2.1 voltage source and ground, as indicated. It is therefore noted that the internal +2.1 volts is the first voltage level of the input logic signal IN discussed above In operation, during the disable mode, the enable/disable signal ENABLE is logic 0, here a voltage level of ground. In the disable mode, the output of the inverter 20 is the first voltage level i.e., +2.1 volts. Such +2.1 volts turns transistor $N_3$ "on" thereby driving the voltage at junction 16 and at the output terminal OUT to ground (here an output 0 logic state) independent of the logic state of the input logic signal IN.

In the enable mode, the enable/disable signal ENABLE is a logic 1, here the first voltage level, +2.1 volts. In such enable mode, if the input logic signal IN is a logic 0, here ground, transistors $N_1$ and $P_2$, turn "on" and transistors $N_2$ and $P_1$, turn "off" thereby producing the third voltage level, +2.5 volts, at the junction 16. The third voltage level (+2.5 volts), here an output logic 1, is coupled to the OUT line because transistor N3 is "off". On the other hand, if during the enable mode the input logic signal IN is logic 1, here +2.1 volts, transistors $N_1$ and $P_2$ turn "off" while transistors $N_2$ and $P_1$ turn "on" thereby driving junction 16 to ground. This ground, i.e., output logic 0 state appears at the output terminal OUT because transistor N3 is "off".

It is noted that use of a low threshold (Vt) N MOSFET $N_1$ tends to result in a leakage path being formed during the disable mode from the +2.5 volt external supply via transistors $P_1$ and $N_1$, when the input logic signal IN is a logic 0. A modification of the level-shifting circuitry 10 which removes this leakage current is shown in FIG. 3.

Figure 3:
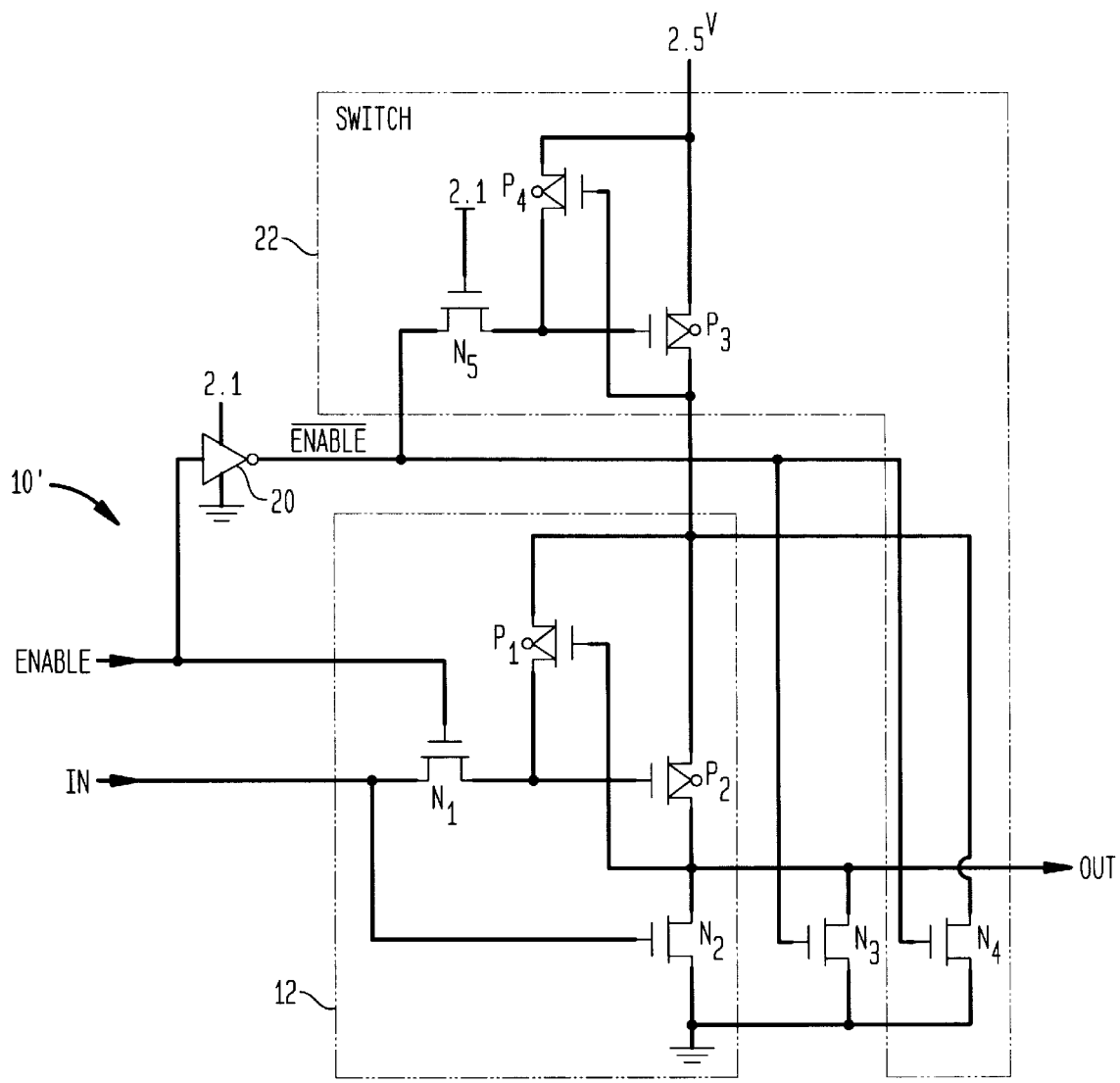
FIG. 3 is a schematic diagram of a level-shifting circuit according to the invention.

Thus, referring to FIG. 3, a switch 22 is provided to decouple the external +2.5 volt supply from the level shifting section 12 (FIG. 2), and more particularly from transistors $P_1$ and $N_1$, during the disable mode. The switch 22 is responsive to the output of the inverter 20. The switch 22 is coupled between the source of the third voltage level (here the +2.5 external supply) and: (a) first electrodes of the additional transistor $N_4$; and, (b) the first electrode of transistors $P_1$ and $P_2$. More particularly, the switch 22 includes N MOSFETs $N_4$ and $N_5$, and P MOSFETs $P_3$ and $P_4$ arranged as shown.

In operation, during the disable mode, the enable/disable signal ENABLE is at ground thereby resulting in the inverter 20 producing +2.1 volts at its output. Such +2.1 volts turns transistor $N_3$ "on" thereby driving the voltage at junction 16 and at the output terminal OUT to ground (here an output 0 logic state) independent of the logic state of the input logic signal IN. That is, the voltage at output OUT is at ground (i.e., "low") independent of the logic state of the input logic signal IN. Further, during this disable mode condition, because transistor N3 is "on", transistor $N_5$ is "off" and transistor $N_4$ is "on", thus transistor P4 is "on", thus transistor $P_3$ is turned "off" decoupling the +2.5 voltage source from transistor $P_1$. The "off" condition of transistor $P_3$ thereby prevents any leakage from passing from the +2.5 volt external supply through transistors $P_1$ and $N_1$ independent of whether the input logic signal IN to the level-shifting circuit 10' (FIG. 3) is a logic 1 (here +2.1 volts) or a logic 0 (here ground).

In the enable mode, the output of inverter 20 is at ground, thereby turning transistor $P_3$ "on". Because transistor $P_3$ is "on", the +2.5 volts from the external supply is coupled to the level-shifting section, and more particularly to transistors $P_2$, $P_2$ and $N_4$. During the enable mode, when the input logic signal IN is logic 0, (i.e., ground), transistors $N_1$, $P_2$ are "on" while transistors $N_2$, $N_3$ and $N_4$ are "off" thereby resulting in a +2.5 volt logic 1 signal being produced on output OUT. On the other hand, when the input logic signal IN is logic 1, i.e., +2.1 volt signal, during the enable mode, transistor $N_1$ turns "off" and transistor $N_2$ turns "on" thereby producing a logic 0, here ground voltage level, at the output OUT.

A number of embodiments of the invention have been described. Nevertheless, it will be understood that various modifications may be made without departing from the spirit and scope of the invention. Accordingly, other embodiments are within the scope of the following claims.

What is claimed is:

1. Level shifting circuitry, comprising,
   a level shifting section responsive to a input logic signal, such input logic signal having a first voltage level representative of a first logic state or a second voltage level representative of a second logic state, such level shifting section providing an output logic signal, such output logic signal having a third voltage level representative of the first logic state of the input logic signal, such section having:
   an input transistor having a control electrode, a first electrode coupled to the input logic signal, and a second electrode; and
   an output pair of complementary type transistors serially coupled between a source of the third voltage level and the second voltage level, a control electrode of a first one of the pair of transistors being coupled to the second electrode of the input transistor;
   a junction between the output pair of transistors providing an output terminal for the level shifting circuitry, and wherein a control electrode of the second one of the pair of transistors is connected to the first electrode of the input transistor;

an additional transistor having a control electrode connected to the junction, a first electrode coupled to the source of the third voltage level and a second electrode connected to the second electrode of the input transistor and the control electrode of the first one of the pair of transistors;

an enable/disable section, coupled to the level shifting section and responsive to an enable/disable signal, such enable/disable signal being a logic signal fed to the control electrode of the input transistor, such enable/disable signal having the first voltage level during an enable mode and having the second voltage level during a disable mode, such enable/disable section driving the output terminal of the level shifting circuit to a predetermined voltage level during the disable mode; and including a switch responsive the enable/disable signal for decoupling the source of the third voltage level from the level shifting section during the disable mode.

2. Level shifting circuitry, comprising, a level shifting section responsive to a input logic signal, such input logic signal having, a first voltage level representative of a first logic state or a second voltage level representative of a second logic state, such level shifting section providing an output logic signal, such output logic signal having a third voltage level representative of the first logic state of the input logic signal, such section having:

an input transistor having a control electrode, a first electrode coupled to the input logic signal, and a second electrode; and an output pair of complementary type transistors serially coupled between a source of the third voltage level and the second voltage level, a control electrode of a first one of the pair of transistors being coupled to the second electrode of the input transistor;

a junction between the output pair of transistors providing an output terminal for the level shifting circuitry, and wherein a control electrode of the second one of the pair of transistors is connected to the first electrode of the input transistor;

an additional transistor having a control electrode connected to the junction, a first electrode coupled to the source of the third voltage level and a second electrode connected to the second electrode of the input transistor and the control electrode of the first one of the pair of transistors;

an enable/disable section, coupled to the level shifting section and responsive to an enable/disable signal, such enable/disable signal being a logic signal fed to the control electrode of the input transistor, such enable/disable signal having the first voltage level during an enable mode and having the second voltage level during a disable mode, such enable/disable section driving the output terminal of the level shifting circuit to a predetermined voltage level during the disable mode; and a switch responsive the enable/disable signal for preventing current flow to the additional transistor during the disable mode.

3. Level shifting circuitry, comprising, a level shifting section responsive to a input logic signal, such input logic signal having a first voltage level representative of a first logic state or a second voltage level representative of a second logic state, such level shifting section providing an output logic signal, such output logic signal having a third voltage level representative of the first logic state of the input logic signal, such section having:

an input transistor having a control electrode, a first electrode coupled to the input logic signal, and a second electrode; and an output pair of complementary type transistors serially coupled between a source of the third voltage level and the second voltage level, a control electrode of a first one of the pair of transistors being coupled to the second electrode of the input transistor;

a junction between the output pair of transistors providing an output terminal for the level shifting circuitry, and wherein a control electrode of the second one of the pair of transistors is connected to the first electrode of the input transistor;

an additional transistor having a control electrode connected to the junction, a first electrode coupled to the source of the third voltage level and a second electrode connected to the second electrode of the input transistor and the control electrode of the first one of the pair of transistors;

an enable/disable section, coupled to the level shifting section and responsive to an enable/disable signal, such enable/disable signal being a logic signal fed to the control electrode of the input transistor, such enable/disable signal having the first voltage level during an enable mode and having the second voltage level during a disable mode, such enable/disable section driving the output terminal of the level shifting circuit to a predetermined voltage level during the disable mode;

wherein the enable/disable section includes:

a gating transistor having a first electrode connected to the junction and a second electrode connected to the second electrode of the second one of the pair of transistors; and an inverter coupled between the first electrode of the input transistor and a control electrode of the gating transistor;

including a switch responsive to an output of the inverter, such switch being coupled between the source of the third voltage level and; the output terminal; the first electrodes of the additional transistor, and, the first electrode of the first one of the pair of transistors.

* * * * *